United States Patent
Chen et al.

(10) Patent No.: US 11,205,646 B2
(45) Date of Patent: *Dec. 21, 2021

(54) DISPLAY PANEL AND DISPLAY DEVICE INCLUDING THE SAME

(71) Applicant: InnoLux Corporation, Miao-Li County (TW)

(72) Inventors: Ying-Jen Chen, Miao-Li County (TW); An-Chang Wang, Miao-Li County (TW); Hsia-Ching Chu, Miao-Li County (TW); Ming-Chien Sun, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/942,211

(22) Filed: Jul. 29, 2020

(65) Prior Publication Data

US 2020/0357789 A1    Nov. 12, 2020

Related U.S. Application Data

(63) Continuation of application No. 16/208,611, filed on Dec. 4, 2018, now Pat. No. 10,784,254, which is a
(Continued)

(30) Foreign Application Priority Data

Jun. 8, 2016 (TW) .................. 105118112

(51) Int. Cl.
*G02F 1/1343* (2006.01)
*G02F 1/1362* (2006.01)
(Continued)

(52) U.S. Cl.
CPC ............... *H01L 27/04* (2013.01); *F21V 9/30* (2018.02); *G02F 1/015* (2013.01); *G02F 1/1333* (2013.01); *G02F 1/1343* (2013.01); *G02F 1/136227* (2013.01); *G02F 1/136286* (2013.01); *H01L 2227/32* (2013.01)

(58) Field of Classification Search
CPC ............ G02F 1/136286; G02F 1/1368; G02F 1/133345; G02F 1/134363; G02F 1/136227; G02F 1/133707; G02F 1/134309; G02F 1/134318; G02F 1/13439; G02F 1/1343; G02F 1/1362; G02F 1/1333; G02F 1/015; G02F 2201/123; G02F 2201/121; G02F 2202/10; H01L 2227/32; H01L 27/04; F21V 9/30
See application file for complete search history.

(56) References Cited

U.S. PATENT DOCUMENTS

| | | | |
|---|---|---|---|
| 10,784,254 B2* | 9/2020 | Chen | .................. G02F 1/015 |
| 2016/0370678 A1* | 12/2016 | Ono | .................. G02F 1/136286 |
| 2019/0103399 A1 | 4/2019 | Chen et al. | |

* cited by examiner

*Primary Examiner* — Thoi V Duong
(74) *Attorney, Agent, or Firm* — Bacon & Thomas, PLLC

(57) ABSTRACT

A display device includes: a substrate; a scan line disposed on the substrate; a common electrode disposed on the substrate and including a through hole having a curved edge, wherein the through hole and at least a portion of the scan line are overlapped; a pixel electrode disposed on the substrate and including a slit; and an active layer disposed on the substrate, wherein the active layer and at least a portion of the slit are overlapped.

14 Claims, 12 Drawing Sheets

Related U.S. Application Data continuation of application No. 15/599,547, filed on May 19, 2017, now Pat. No. 10,181,467.

(51) Int. Cl.
*G02F 1/1333* (2006.01)
*H01L 27/04* (2006.01)
*F21V 9/30* (2018.01)
*G02F 1/015* (2006.01)

DISPLAY PANEL AND DISPLAY DEVICE INCLUDING THE SAME

CROSS REFERENCE TO RELATED APPLICATION

This application claims the benefits of the Taiwan Patent Application Serial Number 105118112, filed on Jun. 8, 2016, the subject matter of which is incorporated herein by reference.

This application is a continuation (CA) of U.S. Patent application for "Display panel and display device including the same", U.S. application Ser. No. 16/208,611 filed Dec. 4, 2018; U.S. application Ser. No. 16/208,611 is a continuation of U.S. Patent application for "Display panel and display device including the same", U.S. application Ser. No. 15/599,547 filed May 19, 2017, and the subject matter of which is incorporated herein by reference.

BACKGROUND

1. Field

The present disclosure relates to a display panel and a display device including the same and, more particularly, to a display panel that a through hole of a common electrode has a specific designed shape and a display device including the same.

2. Description of Related Art

With the continuous advancement of technologies related to displays, all the display panels are now developed toward compactness, thinness, and lightness. This trend makes thin displays, such as liquid crystal display panels, organic light-emitting diode display panels and inorganic light-emitting diode display panels, replacing cathode-ray-tube displays as the mainstream display devices on the market. Applications of thin displays are numerous. Most electronic products for daily use, such as mobile phones, notebook computers, video cameras, still cameras, music displays, mobile navigators, and TV sets, employ such display panels.

Among the developed thin displays, LCD display devices particularly enjoy technical maturity, and manufacturers pay even more effort to improve display devices in terms of display quality thereby answering to ongoing technical development of display devices and consumers' increasing demands.

Therefore, the elements comprised in the display device still have to be improved, so a display device with higher display quality can be provided to meet the consumers' increasing demands.

SUMMARY

The display device of the present disclosure comprises: a substrate; a scan line disposed on the substrate; a common electrode disposed on the substrate and comprising a through hole having a curved edge, wherein the through hole and at least a portion of the scan line are overlapped; a pixel electrode disposed on the substrate and comprising a slit; and an active layer disposed on the substrate, wherein the active layer and at least a portion of the slit are overlapped.

Other novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and effects of the present disclosure. Through the exposition by means of the specific embodiments, people would further understand the technical means and effects of the present disclosure. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other substrate or film, but also intended indirectly contact with the other substrate or film.

Furthermore, the features in different embodiment of the present disclosure can be mixed to form another embodiment.

Figure 1:
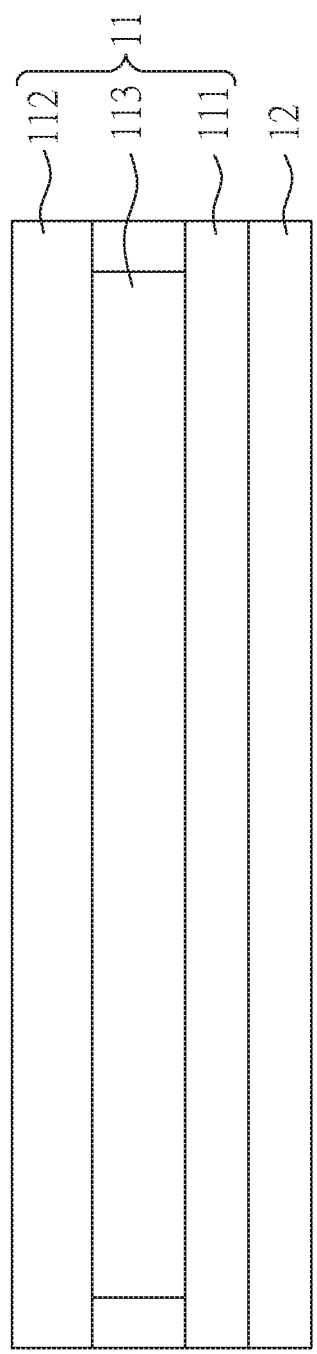
FIG. 1 is a cross-sectional view of a display device according to one embodiment of the present disclosure.

FIG. 1 is a cross-sectional view of a display device according to one embodiment of the present disclosure. The display device of the present embodiment comprises: a display panel 11; and a backlight module 12 disposed below the display panel 11. The display panel 11 comprises: a substrate 111; a counter substrate 112 opposite to the substrate1 111 and a display medium layer 113 disposed between the substrate 111 and the counter substrate 112. In the present embodiment, the substrate 111 can be a transistor substrate with transistors (not shown in the figure) formed thereon; and the counter substrate 112 can be a color filter substrate with a color filter layer (not shown in the figure) and a black matrix layer (not shown in the figure) formed thereon. However, in other embodiment of the present disclosure, the color filter layer (not shown in the figure) can be disposed on the substrate 111; and in this case, the substrate 111 is a color filter on array (COA) substrate. Alternatively, the black matrix layer (not shown in the figure) can be disposed on the substrate; and in this case, the substrate 111 is a black matrix on array (BOA) substrate. In addition, the display medium layer 113 in the display device of the present disclosure is a liquid crystal layer. Hereinafter, the features of the elements disposed on the substrate 111 are illustrated. It should be noted that "element" in the present disclosure is not directed to any particular object but is a general term used to indicate any object disposed on the substrate 111.

Figure 2A:
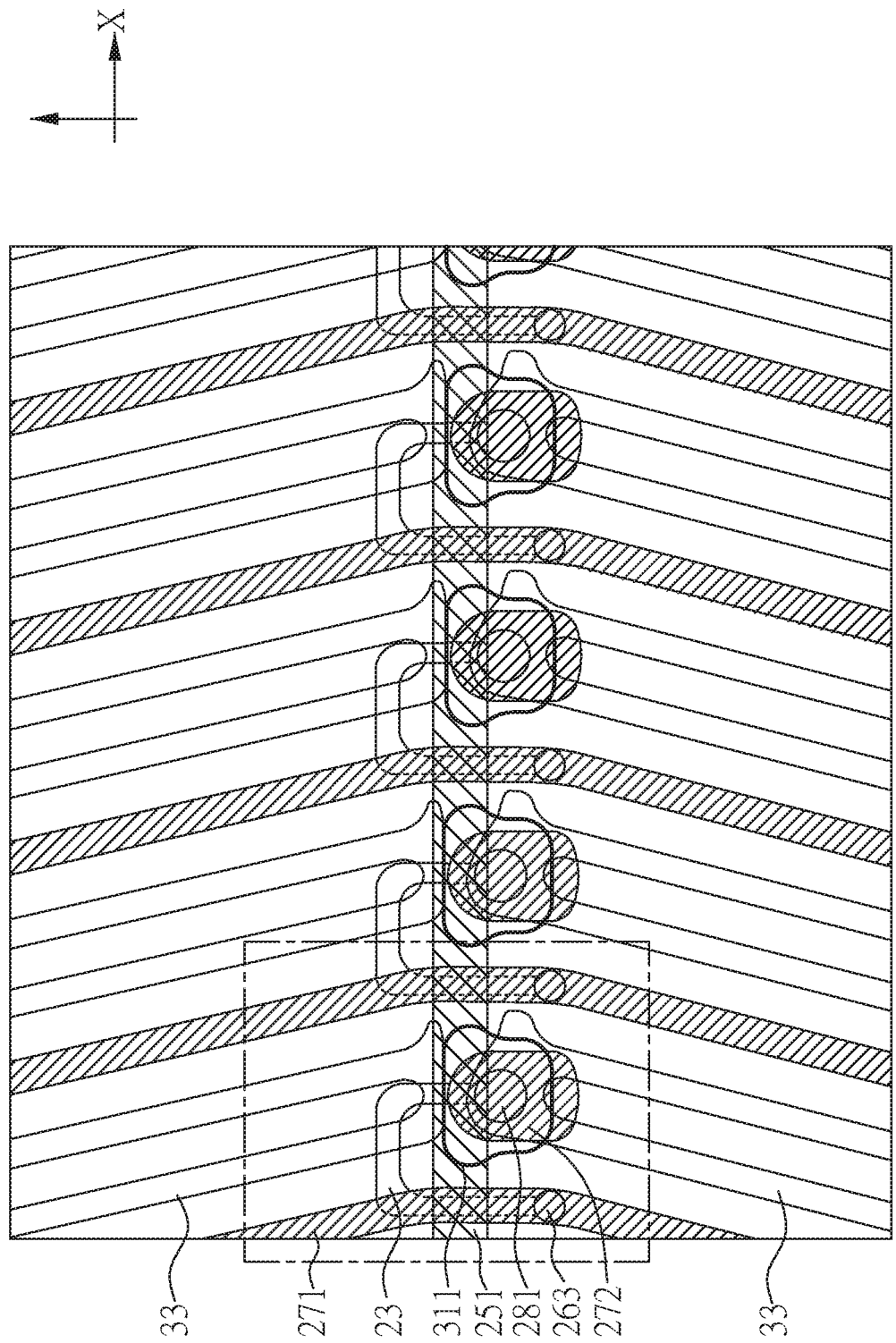
FIGS. 2A to 2C are top views showing elements on a substrate of a display device according to one embodiment of the present disclosure.
Figure 2B:
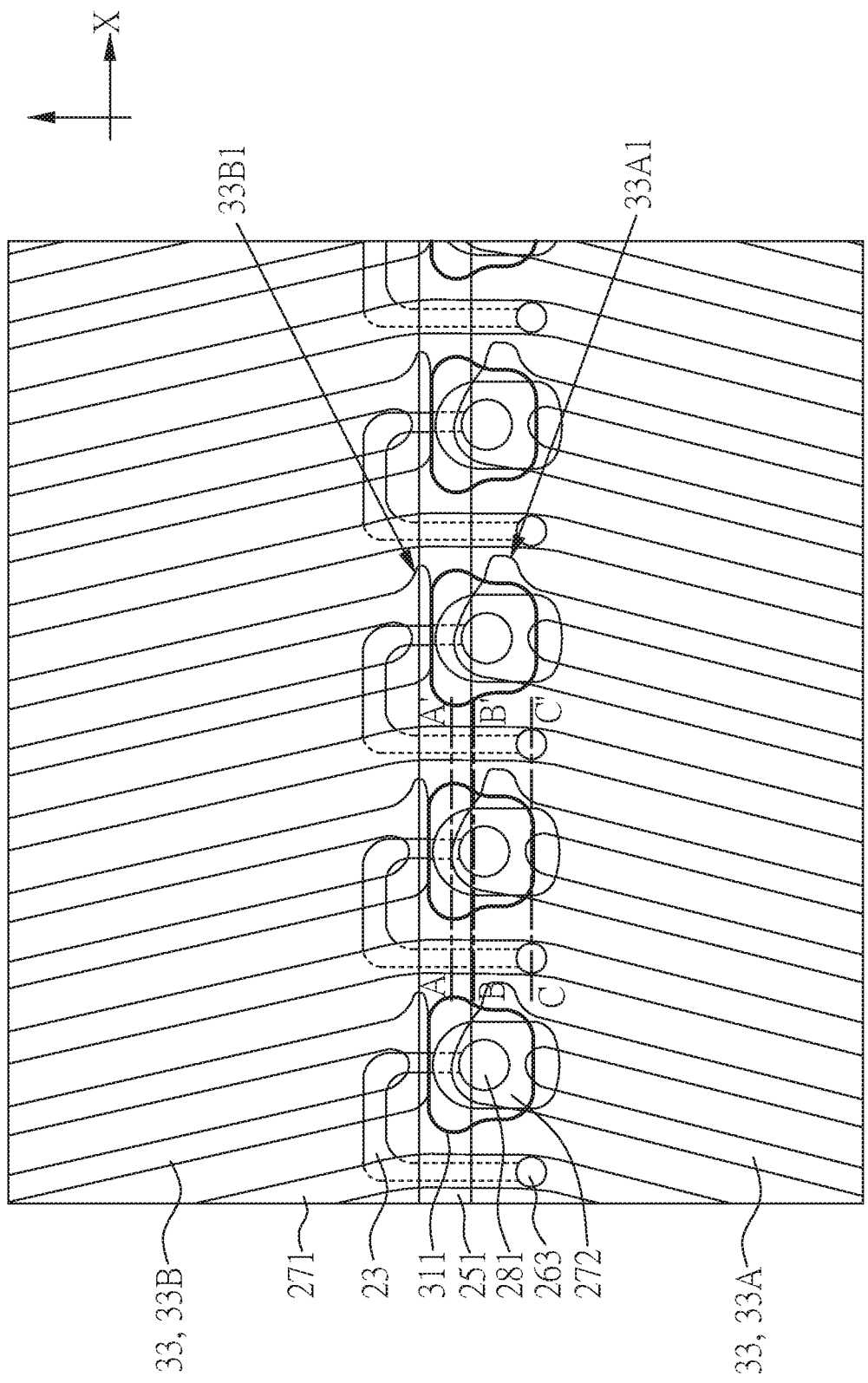
Figure 2C:
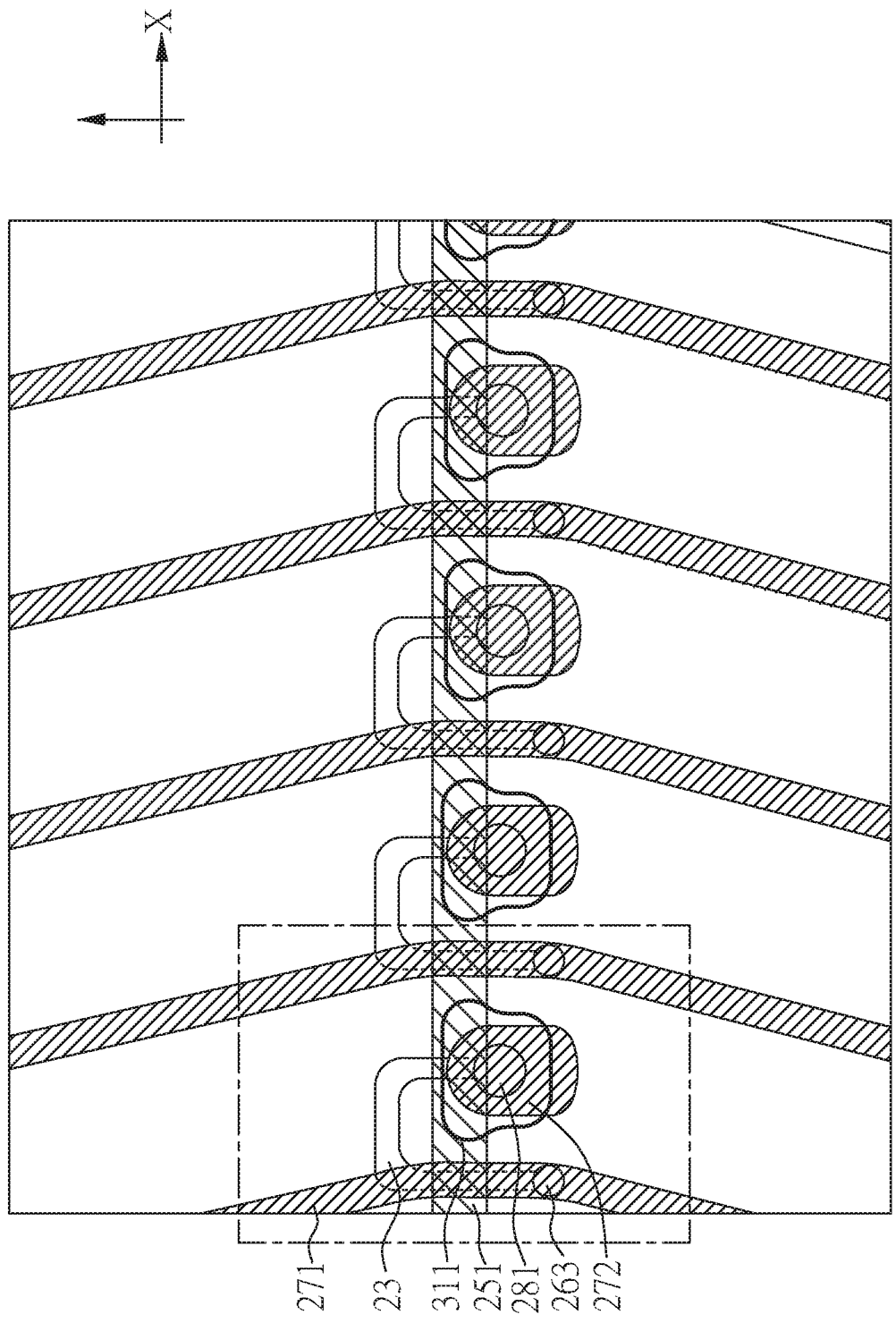
Figure 3A:
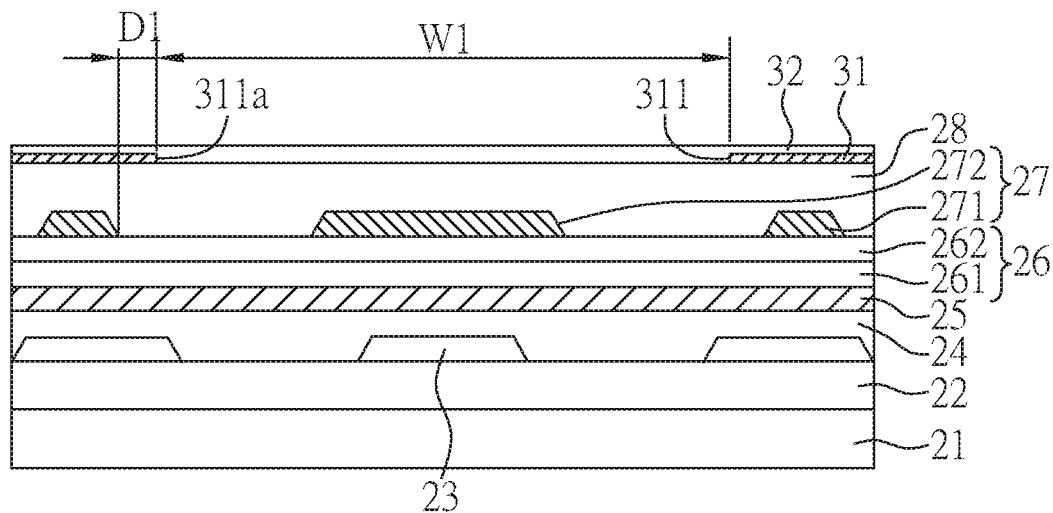
FIG. 3A is a cross-sectional view at the line A-A' indicated in FIG. 2B.
Figure 3B:
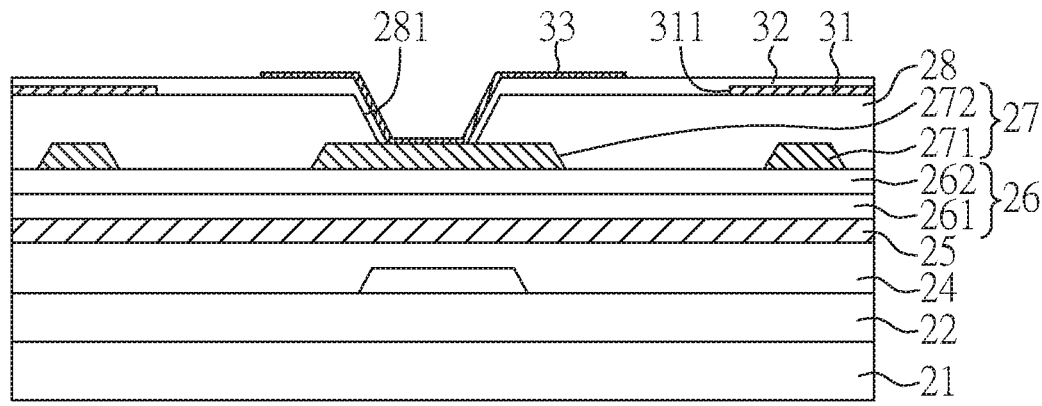
FIG. 3B is a cross-sectional view at the line B-B' indicated in FIG. 2B.
Figure 3C:
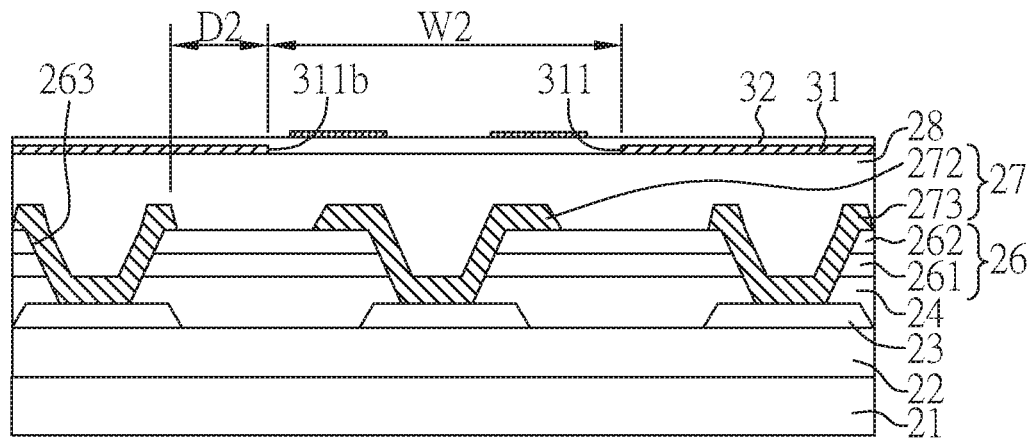
FIG. 3C is a cross-sectional view at the line C-C' indicated in FIG. 2B.

FIGS. 2A to 2C are top views showing elements on a substrate of a display device according to one embodiment of the present disclosure, wherein the difference between FIG. 2A and FIG. 2B is that the hatching lines of some layers in FIG. 2A are not shown in FIG. 2B for simplification, and the difference between FIG. 2A and FIG. 2C is that pixel electrodes are not shown in FIG. 2C to clearly illustrate the relation between through holes of a common electrode and a scan line. FIGS. 3A to 3C are cross-sectional views at the lines A-A', B-B' and C-C' indicated in FIG. 2B. In the present embodiment, a low temperature polysilicon (LTPS) transistor substrate is exemplified. However, the present disclosure is not limited thereto, and an amorphous transistor substrate, an IGZO transistor substrate or other transistor substrates can also be applied in the display device of the present disclosure.

The elements disposed on the substrate can be prepared by any known process in the art. In brief, as shown in FIGS. 3A, 3B and 3C, a substrate 21 is provided, and a buffer layer 22 is disposed on the substrate 21. Next, active layers 23 which are polysilicon layers are formed on the buffer layer 22, followed by forming a gate insulating layer 24 on the active layers 23 and the buffer layer 22. Then, a first metal layer 25 is formed on the gate insulating layer 24, and the first metal layer 25 comprises plural scan lines 251. A first insulating layer 26 is formed on the first metal layer 25. Herein, the first insulating layer 26 is a double layered insulating layer comprising two insulating layers 261, 262, but the present disclosure is not limited thereto.

Next, a second metal layer 27 is formed on the first insulating layer 26. The second metal layer 27 comprises plural data lines 271, drain electrodes 272 and source electrodes 273, wherein the drain electrodes 272 and the source electrodes 273 electrically connects to the active layers 23 through openings 263 of the first insulating layer 26. A second insulating layer 28 is formed on the first insulating layer 26 and the second metal layer 27. A common electrode 31 is formed on the second insulating layer 28. In a top view toward a surface of the substrate 21, which means along a direction perpendicular to a surface of the substrate 21, the common electrode 31 includes through holes 311. The through holes 311 overlap the drain electrodes 272 and a part of the scan lines 251. Then, a third insulating layer 32 is formed on the common electrode 31. Pixel electrodes 33 are fanned on the third insulating layer 32, wherein the pixel electrodes 33 electrically connect to the drain electrodes 272 through the contact holes 281. As shown in FIGS. 1 and 3B, the display medium layer 113 can be disposed between the counter substrate 112 and the pixel electrodes 33 after assembling the substrate 21 and the counter substrate 112.

Referring to FIG. 2B, each of pixel electrode 33A and 33B is divided into an upper part and a lower part, and only an upper part of the pixel electrode 33A and a lower part of the pixel electrode 33B are shown in FIG. 2B. The upper part of the pixel electrode 33A has a first protrusion 33A1 and the lower part of the pixel electrode 33B has a second protrusion 33B1. Although FIG. 2B does not show, the pixel electrode 33A also has a lower part which is substantially the same as the lower part of the pixel electrode 33B. Therefore, the upper part of the pixel electrode 33A includes a first protrusion 33A1 which is near to the through hole 311, and the lower part (although not shown) of the pixel electrode 33A includes a second protrusion which is far from the through hole 311 compared with the first protrusion 33A1.

In the display device of the present embodiment, the substrate 21 can be prepared by glass, plastics, flexible materials, thin films or other substrate materials. When the substrate 21 is prepared by plastics, flexible materials or thin films, a flexible display device can be obtained. The flexible material can include PI (polyimide), PC (polycarbonate), PET (polyethylene terephthalate), or the like. The buffer layer 22, the gate insulating layer 24, the first insulating layer 26, the second insulating layer 28 and the third insulating layer 32 can be prepared by inorganic insulating materials or organic insulating materials. The inorganic insulating material can include silicon oxides, silicon nitrides, silicon oxynitrides, or the like. The organic insulating material can include PFA (perfluoroalkoxy resin) or the like. The first metal layer 25 and the second metal layer 27 can be prepared by conductive materials such as metals, alloys, metal oxides, metal nitrides or other electrode materials. The common electrode 31 and the pixel electrode 33 can be prepared by transparent conductive materials, for examples ITO, IZO or ITZO. However, in other embodiment of the present disclosure, the materials of the aforesaid elements are not limited to the examples illustrated before.

As shown in FIGS. 2A and 3A, the display panel of the present embodiment comprises: a substrate 21; plural scan lines 251 (belonged to the first metal layer 25) disposed on the substrate 21, wherein the plural scan lines 251 extend along a first direction X; a first insulating layer 26 disposed on the plural scan lines 251; plural data lines 271 (belonged to the second metal layer 27) disposed on the first insulating layer 26, wherein the plural data lines 271 extend along a second direction, and the first direction X is different from the second direction; a second insulating layer 28 disposed on the plural data lines 271; and a common electrode 31 disposed on the second insulating layer 28, wherein the common electrode 31 includes a through hole 311. Herein, the plural scan lines 251 respectively extend along the first direction X as indicated in the axis shown in FIG. 2A. The plural data lines 271 respectively extend along the second direction, wherein as long as the first direction X is different from the second direction, the second direction is not necessarily perpendicular to the first direction X and an angle can be included between the second direction and the first direction X (for example, an angle of 80-90 degree, or an angle of 85-90 degree).

Hereinafter, the feature of the through of the common electrode 31 is illustrated in detail.

Figure 4A:
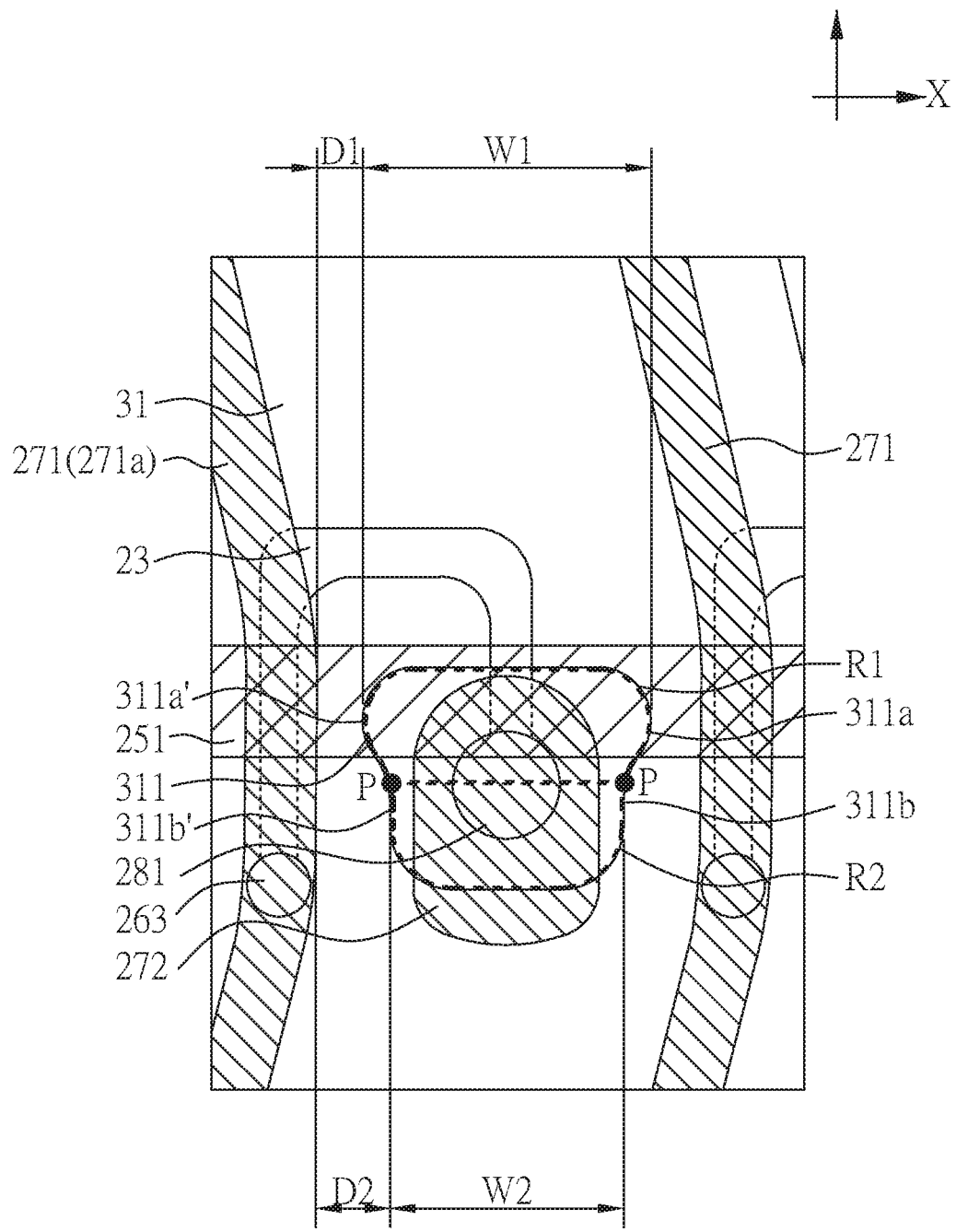
FIGS. 4A and 4B are partial enlarged views of FIG. 2C.

FIG. 4A is a partial enlarged view of FIG. 2C. In the display panel of the present embodiment, the through hole 311 of the common electrode 31 includes a first region R1 and a second region R2. In a top view toward a surface of the substrate, the first region R1 overlaps at least one of the plural scan lines 251 along a direction perpendicular to the surface of the substrate, the second region R2 does not overlap the at least one of the plural scan lines 251 along a direction perpendicular to the surface of the substrate. Or, the first region R1 and the second region R2 are adjacent to each other. The first region R1 has a first edge 311*a* and the second region R2 has a second edge 311b. And the first edge 311a and the second edge 311b intersect at two inflection points P in which the first edge 311a changes from being concave to convex or the second edge 311b changes from being concave to convex. Herein, the first edge 311a refers to an edge of the through hole 311 corresponding to the first region R1, and the second edge 311b refers to another edge of the through hole 311 corresponding to the second region R2. In the display panel of the present embodiment, the first region R1 has a first maximum width W1 along the first direction X, the second region R2 has a second maximum width W2 along the first direction X, and a ratio of the second maximum width W2 over the first maximum width W1 (W2/W1) is greater than 0 and less than 1 (0<W2/W1<1).

In general, the common electrode 31 includes a through hole 311, and a part of the drain electrode 272 is exposed from the through hole 311. Hence, the pixel electrode 33 above the common electrode 31 can electrically connect to the drain electrode 272. Although the aforesaid purpose of electrically connecting the pixel electrode 33 and the drain electrode 272 can also be accomplished when the first maximum width W1 of the first region R1 is identical to the second maximum width W2 of the second region, a capacitance is formed at the overlapping region of the common electrode 31 and the san line 251 (i.e. the first region R1), resulting in the display quality decreased. Hence, in the display panel of the present embodiment, the area of the scan line 251 capable of exposing from the first region R1 of the through hole 311 is increased by enlarging the first region R1 (especially, by increasing the first maximum width W1 of the first region R1 along the first direction X). Therefore, the area of the overlapping region of the common electrode 31 and the scan line 251 can be reduced, so the capacitance formed between the common electrode 31 and the scan line 251 can be decreased and the display quality of the display device can be increased.

In addition, in the display panel of the present embodiment, in a top view toward a surface of the substrate, the common electrode 31 overlaps at least a portion of the plural data lines 271 along a direction perpendicular to the surface of the substrate. More specifically, the through hole 311 of the common electrode 31 is located between two of the plural data lines 271, and the two of the plural data lines 271 are adjacent to each other. Therefore, the transmittance of the display device can be improved. In particular, in the display panel of the present embodiment, one of the plural data lines 271 adjacent to a first edge 311a of the first region R1 is defined as a first data line 271a, a first minimum distance D1 is between the first data line 271a and the first edge 311a, a second minimum distance D2 is between the first data line 271a and a second edge 311b of the second region R2, and the first minimum distance D1 is greater than 0 μm and less than the second minimum distance D2 (0 μm<D1<D2). In other word, a section of the first edge 311a adjacent to the first data line 271a is defined as a first section 311a', a section of the second edge 311b adjacent to the first data line 271a is defined as a second section 311b', the first section 311a' is spaced apart from the first data line 271a by a first minimum distance D1, the second section 311b' is spaced apart from the first data line 271a by a second minimum distance D2, and the first minimum distance D1 is less than the second minimum distance D2. In one embodiment, the first minimum distance D1 is greater than 0 μm and less than the second minimum distance D2 (0 μm<D1<D2). If the first minimum distance D1 is 0 μm, light leakage may be occurred at the area between the common electrode 31 and the data line 271. (i.e. the first data line 271a). Furthermore, in order to decrease the capacitance formed by the common electrode 31 and the scan line 251, the first maximum width W1 of the first region R1 is greater than the second maximum width W2 of the second region R2; therefore, the first minimum distance D1 is less than the second minimum distance D2.

Figure 5:
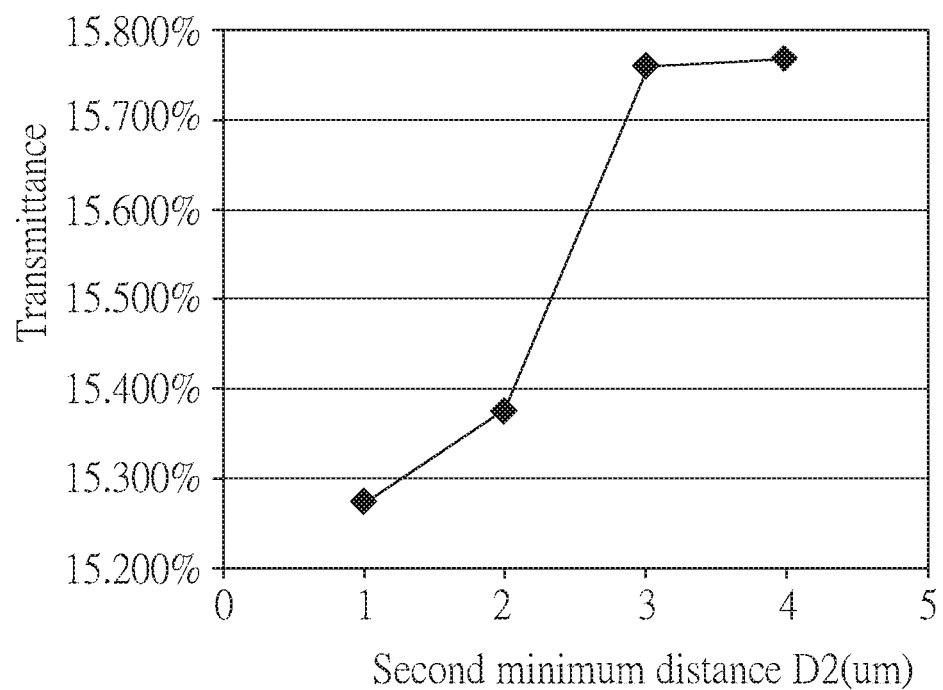
FIG. 5 is a diagram showing a simulation result of a transmittance of a display device according to one embodiment of the present disclosure.

The length of the second minimum distance D2 is not particularly limited, as long as the second region R2 can expose the drain electrode 272, so that the pixel electrode 33 can electrically connect to the drain electrode 272. In one embodiment of the present disclosure, the second minimum distance D2 is equal to or greater than 2 μm and less than 10 μm. In the present embodiment, a simulation of the transmittance of the display device is performed by fixing the first minimum distance D1 to be 2 μm and adjusting the length of the second minimum distance D2. The simulation result is shown in FIG. 5. As the second minimum distance D2 increased, the transmittance of the display device is further improved. In particular, a better transmittance can be obtained when the second minimum distance D2 increases.

Figure 4B:
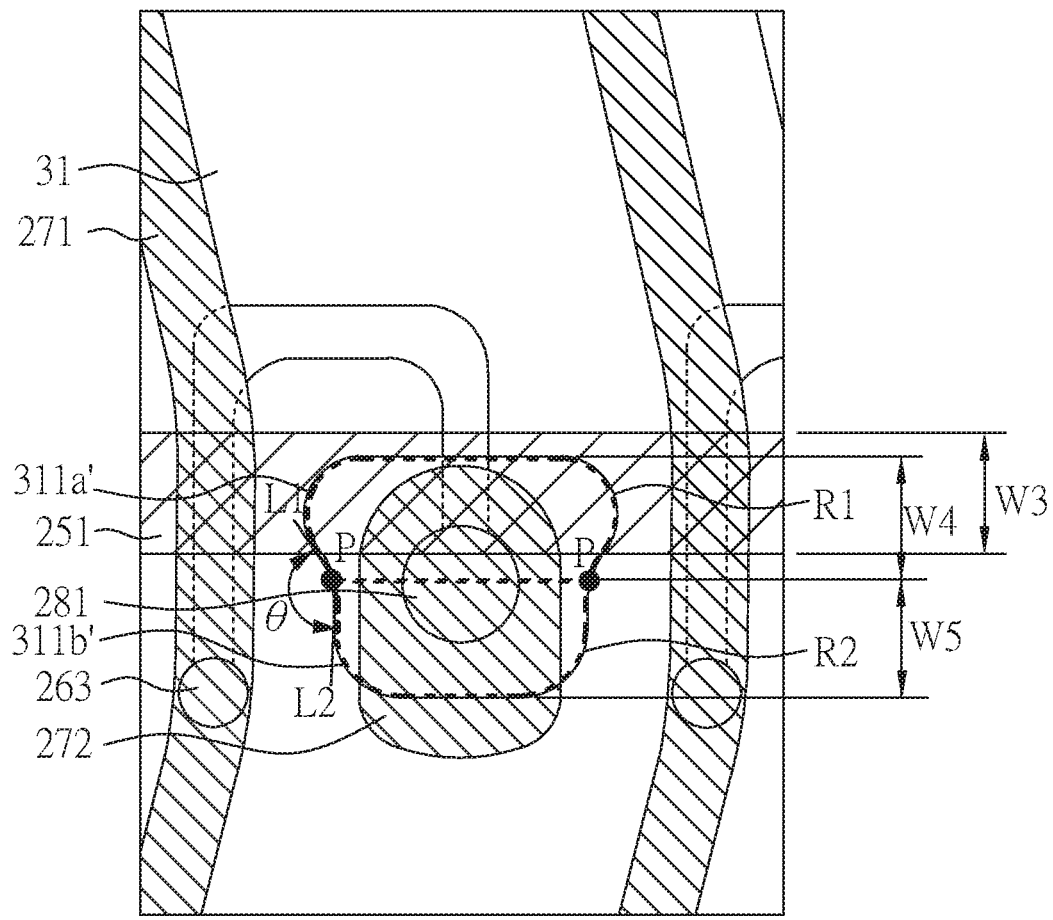

FIG. 4B is a partial enlarged view of FIG. 2C, wherein the difference between FIG. 4A and FIG. 4B is only the symbols. As shown in FIG. 4B, in the display device of the present embodiment, one of the plural scan lines 251 has a third maximum width W3 along the second direction Y, the first region R1 has a fourth maximum width W4 along the second direction Y, and a ratio of the fourth maximum width W4 over the third maximum width W3 is greater than 0.5 and less than or equal to 1 (0.5<W4/W3≤1). Furthermore, the second region R2 has a fifth maximum width W5 along the second direction Y, and a ratio of the fifth maximum width W5 over the fourth maximum width W4 is equal to or greater than 1 and less than 4 (1≤W5/W4<4).

In addition, as shown in FIG. 4B, the first section 311a' of the first edge 311a (shown in FIG. 4A) and the second section 311b' of the second edge 311b (shown in FIG. 4A) intersects at the inflection point P, a first line L1 is tangential to the first section 311a' at the inflection point P, a second line L2 is tangential to the second section 311b' at the inflection point P, and the first line L1 and the second line L2 forms at an angle θ which is equal to or greater than 90 degree and less than or equal to 180 degree. It should be noted that the angle θ is defined in the figure.

Figure 4C:
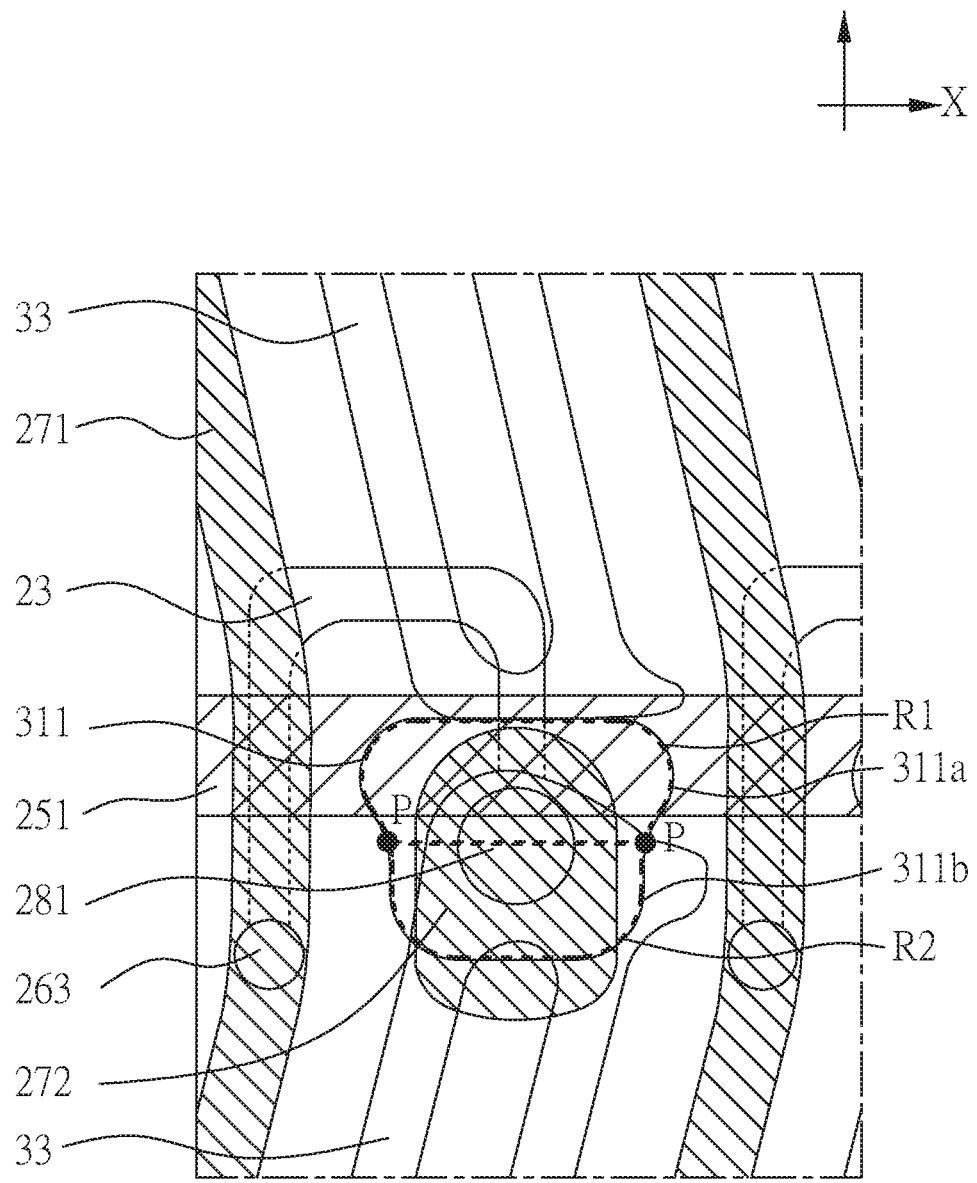
FIG. 4C is a partial enlarged view of FIG. 2A.

FIG. 4C is a partial enlarged view of FIG. 2A. As shown in FIGS. 3B and 4C, the display device of the present embodiment further comprises a third insulating layer 32 and a pixel electrode 33, wherein the third insulating layer 32 is disposed on the common electrode 31, and the pixel electrode 33 is disposed on the third insulating layer 32. In a top view of the display device when observing onto a substrate surface of the substrate 21 (more specifically, observing from the pixel electrode 33 to the substrate 21), the first region R1 at least partially overlaps the pixel electrode 33 along a direction perpendicular to the surface of the substrate. In other embodiment of the present disclosure, the edge of the pixel electrode may be at least partially disposed in the first region R1.

Figure 6A:
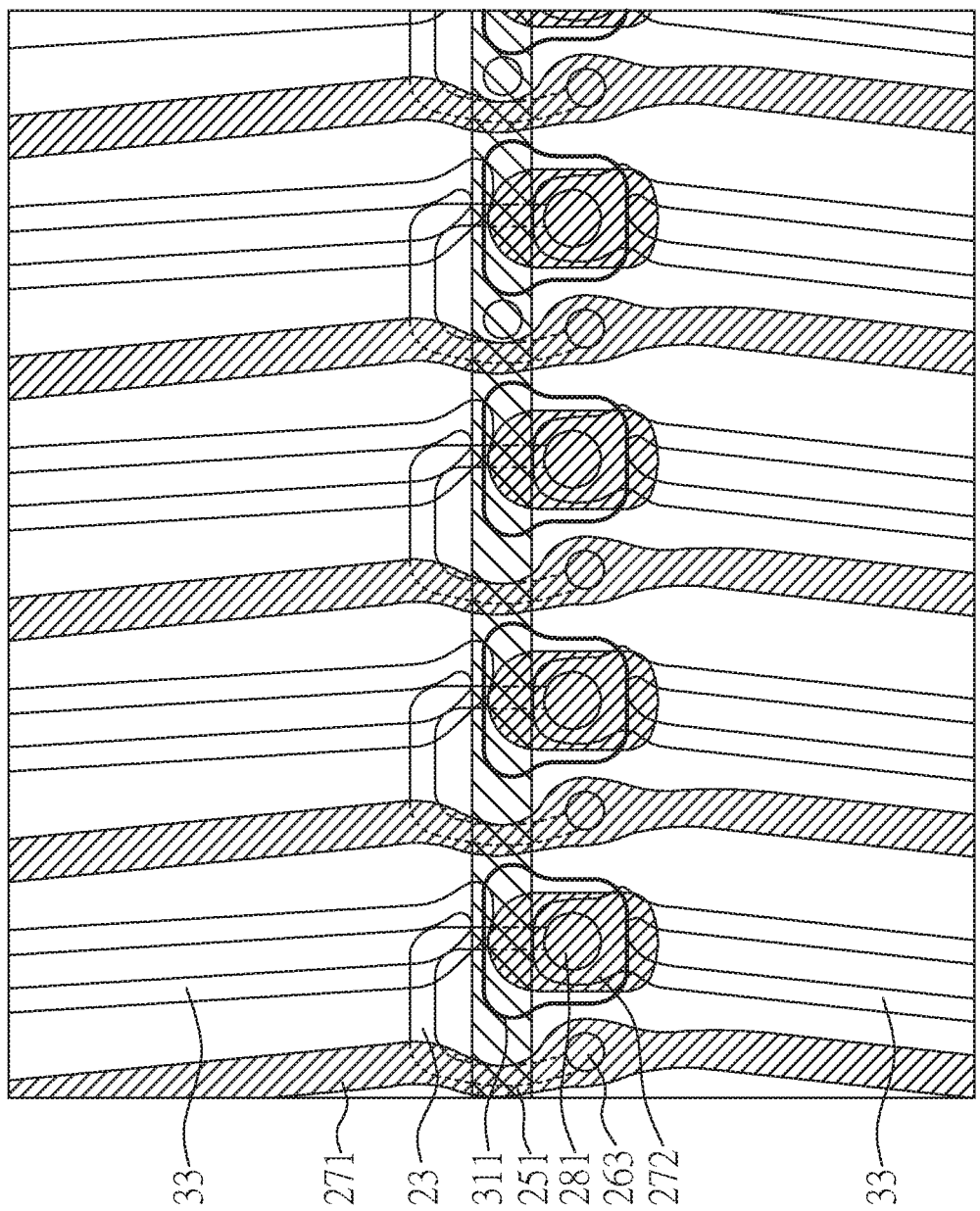
FIGS. 6A and 6B are top views showing elements on a substrate of a display device according to another embodiment of the present disclosure.
Figure 6B:
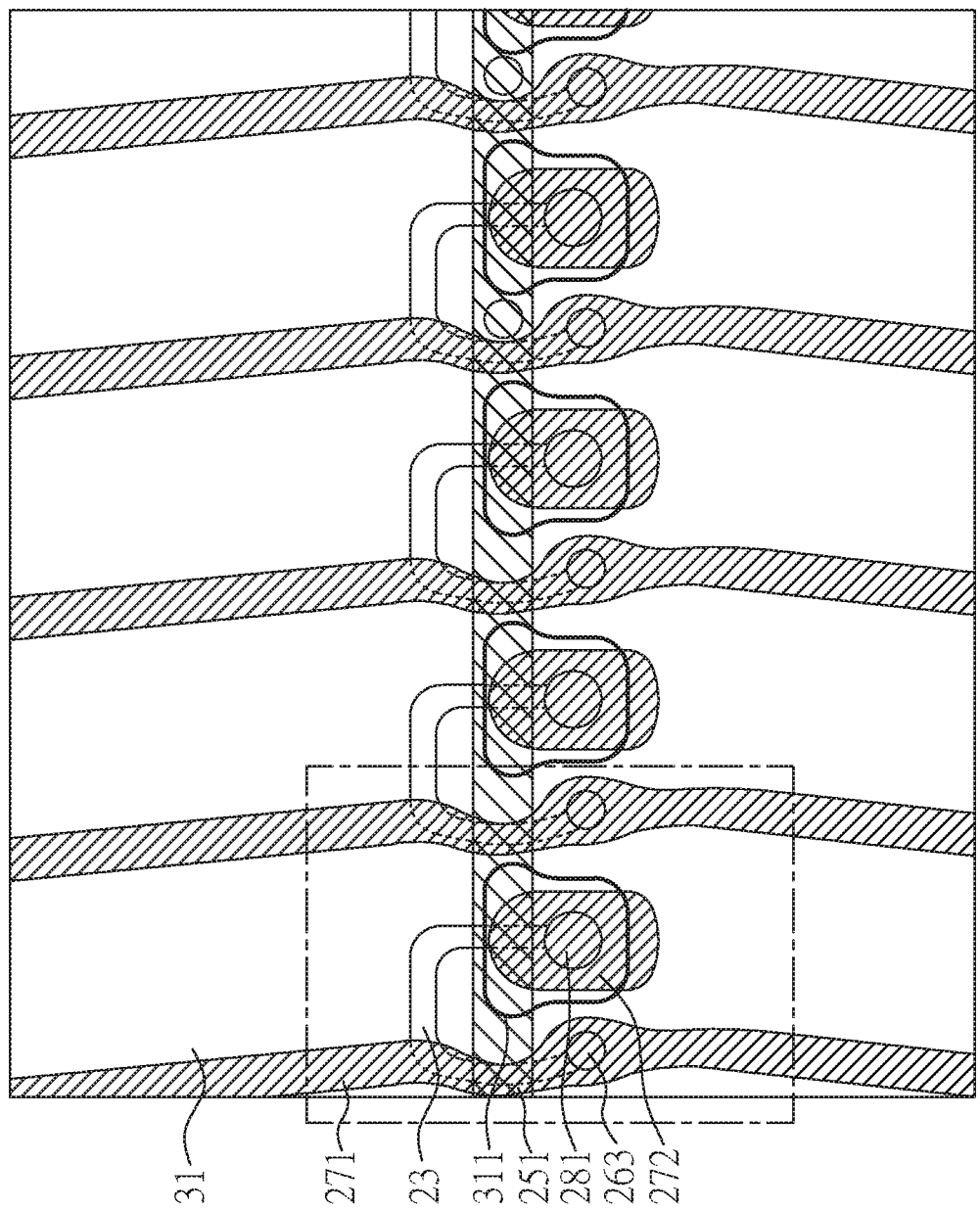

FIGS. 6A and 6B are top views showing elements on a substrate of a display device according to another embodiment of the present disclosure. The display device of the present embodiment is similar to that shown in the aforementioned embodiments, and the main difference is the position of the data lines 271.

Figure 6C:
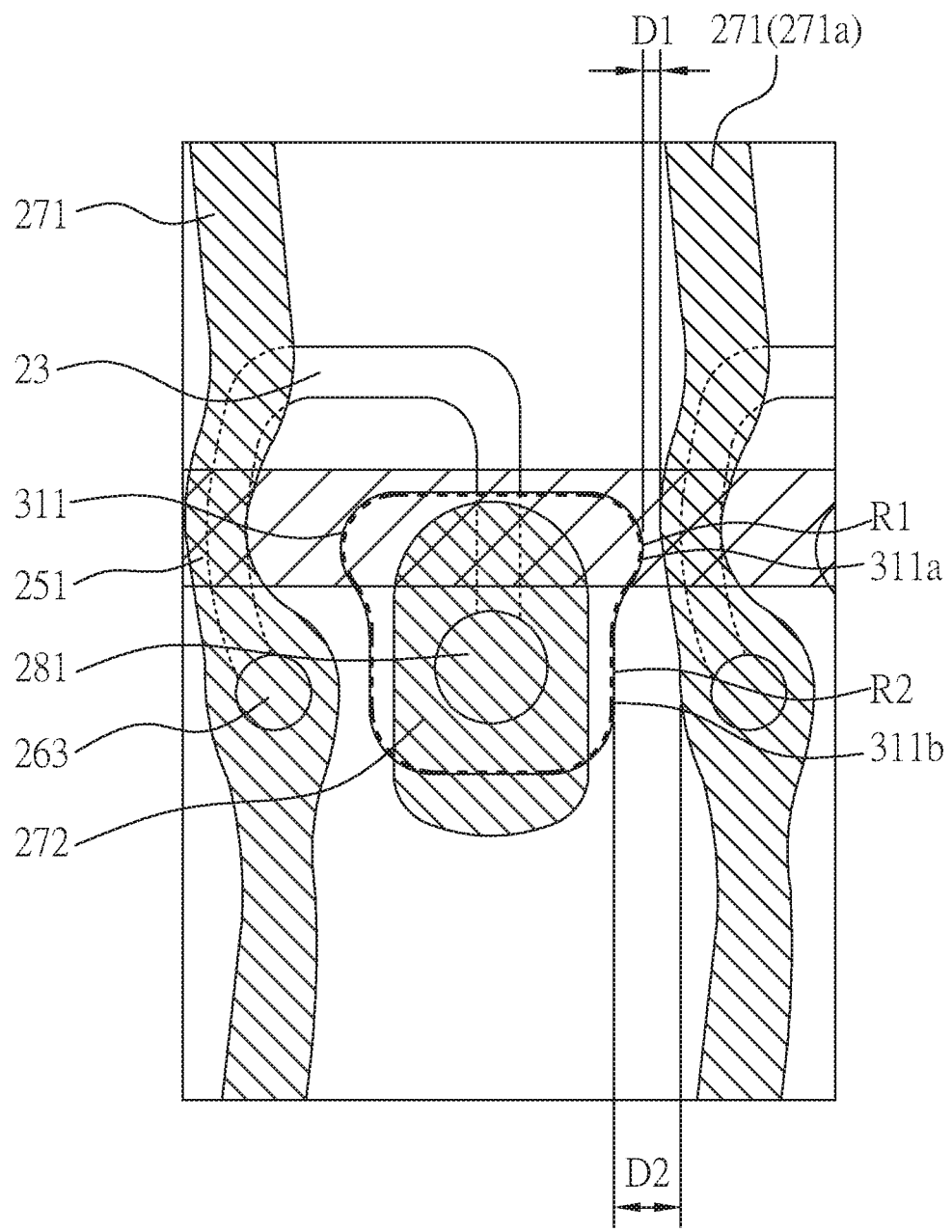
FIG. 6C is a partial enlarged view of FIG. 6B.

FIG. 6C is a partial enlarged view of FIG. 6B. In the present embodiment, one of the data lines adjacent to a first edge 311a of the through hole 311 is defined as a first data line 271a, and the first data line 271a is electrically connected to the adjacent pixel, and is not electrically connected to the pixel that the through hole 311 disposed therein. Similar to the embodiments illustrated before, a first minimum distance D1 is between the first data line 271a and the first edge 311a, a second minimum distance D2 is between the first data line 271a and the second edge 311b, and the first minimum distance D1 is greater than 0 µm and less than the second minimum distance D2 (0 µm<D1<D2).

Please compare FIG. 4A and FIG. 6C. In the display device of the present embodiment, the relation between the first minimum distance D1 and the second minimum distance D2 is decided by the first edge 311a of the through hole 311 and its closest data line. In other word, the data line 271 (i.e. the first data line 271a) closest to the first edge 311a can be the data line of the present pixel (as shown in FIG. 4A) or the data line of the adjacent pixel (as shown in FIG. 6C).

A display device made as described in any of the embodiments of the present disclosure as described previously may be integrated with a touch panel to form a touch display device. Moreover, a display device or touch display device made as described in any of the embodiments of the present disclosure as described previously may be applied to any electronic devices known in the art that need a display screen, such as displays, mobile phones, laptops, video cameras, still cameras, music players, mobile navigators, TV sets, and other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. A display device, comprising:
   a substrate;
   a scan line disposed on the substrate;
   a common electrode disposed on the substrate and comprising a through hole having a curved edge, wherein the through hole and at least a portion of the scan line are overlapped;
   a pixel electrode disposed on the substrate and comprising a slit; and
   an active layer disposed on the substrate, wherein the active layer and at least a portion of the slit are overlapped.

2. The display device of claim 1, wherein the active layer has a curved edge.

3. The display device of claim 1, wherein the active layer is disposed between the common electrode and the substrate.

4. The display device of claim 1, wherein the active layer is disposed between the pixel electrode and the substrate.

5. The display device of claim 1, wherein the active layer and at a portion of the through hole are overlapped.

6. The display device of claim 1, comprising a drain electrode and another pixel electrode disposed on the substrate, and an insulating layer disposed between the drain electrode and the another pixel electrode and comprising a contact hole, wherein the another pixel electrode is electrically connected to the drain electrode through the contact hole, and the contact hole and the through hole are overlapped.

7. The display device of claim 6, wherein the active layer is electrically connected to the drain electrode.

8. The display device of claim 6, wherein the another pixel electrode comprises a first protrusion near to the through hole.

9. The display device of claim 1, wherein the pixel electrode comprises a second protrusion near to the through hole.

10. The display device of claim 1, comprising a data line disposed on the substrate, and an insulating layer disposed between the active layer and the data line and comprising an opening, wherein the active layer is electrically connected to the data line through the opening, and the opening and at least a portion of the data line are overlapped.

11. The display device of claim 1, comprising a drain electrode disposed on the substrate and electrically connected to the active layer, wherein a length of the active layer along a direction is greater than a length of the drain electrode along the direction, and the direction is different from an extension direction of the scan line.

12. The display device of claim 11, wherein the direction is substantially perpendicular to the extension direction of the scan line.

13. The display device of claim I, comprising a drain electrode disposed on the substrate and electrically connected to the active layer, wherein an area that the drain electrode and the through hole are overlapped is greater than an area that the active layer and the through hole are overlapped.

14. The display device of claim 1, comprising a data line disposed on the substrate, wherein the data line has a first region and a second region, the first region is a region that the data line and the scan line are overlapped, the second region is a region that the data line and the scan line are not overlapped, and a width of the first region is equal to or less than a width of the second region.

* * * * *